(12) United States Patent
Nagai et al.

(10) Patent No.: US 7,258,962 B2
(45) Date of Patent: Aug. 21, 2007

(54) POSITIVE-TONE RADIATION-SENSITIVE RESIN COMPOSITION

(75) Inventors: Tomoki Nagai, Tokyo (JP); Takayuki Tsuji, Tokyo (JP)

(73) Assignee: JSR Corporation, Tokyo (JP)

( * ) Notice: Subject to any disclaimer, the term of this patent is extended or adjusted under 35 U.S.C. 154(b) by 166 days.

(21) Appl. No.: 11/117,344

(22) Filed: Apr. 29, 2005

(65) Prior Publication Data

US 2005/0244747 A1 Nov. 3, 2005

(30) Foreign Application Priority Data

Apr. 30, 2004 (JP) .............................. 2004-135912

(51) Int. Cl.
*G03F 7/004* (2006.01)
*G03F 7/30* (2006.01)
(52) U.S. Cl. .................. 430/270.1; 430/326; 430/905; 430/914; 430/920; 430/926
(58) Field of Classification Search ...................... None
See application file for complete search history.

(56) References Cited

U.S. PATENT DOCUMENTS

| 4,491,628 | A | 1/1985 | Ito et al. | |
| 6,846,607 | B2 * | 1/2005 | Nagai et al. | ................ 430/170 |

FOREIGN PATENT DOCUMENTS

| EP | 1193558 | * | 4/2002 |
| EP | 1238972 | A1 | 9/2002 |
| JP | 2-27660 | | 6/1990 |
| JP | 2000034272 | | 2/2000 |
| JP | 2002265446 | | 9/2002 |

OTHER PUBLICATIONS

Okada, et. al., "A New and Practical Method of Decarboxylation: Photosensitized Decarboxylationof N-Acyloxyphthalimides via Electron-Transfer Mechanism," J. Am. Chem. Soc. 1988, vol. 110, pp. 8736-8738.

Shukla, "Synthesis of some new aryl a-(3-substituted-carbazol-9-yl) acetates/propionates as possible anti-inflammatory and analgesic agents," Indian Journal of Chemistry, vol. 33B, Aug. 1994, pp. 799-802.

* cited by examiner

*Primary Examiner*—Rosemary Ashton
(74) *Attorney, Agent, or Firm*—Merchant & Gould, P.C.; Christopher W. Raimund

(57) ABSTRACT

A positive-tone radiation-sensitive resin composition comprising: (A) a carbazole derivative shown by the following formula (1), (B) a photoacid generator containing a sulfonimide compound and an iodonium salt compound as essential components, and (C) an acid-dissociable group-containing resin which is insoluble or scarcely soluble in alkali, but becomes soluble in alkali when the acid-dissociable group dissociates is disclosed.

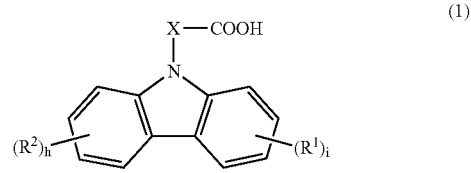

(1)

wherein $R^1$ and $R^2$ are individually halogen atom, methyl, cyano, or nitro group, X is a $C_{1-20}$ organic group, and h and i are 0-4. The resin composition is useful as a chemically amplified positive-tone resist excelling in focal depth allowance, sensitivity, resolution, pattern profile, and PED stability.

13 Claims, No Drawings

POSITIVE-TONE RADIATION-SENSITIVE RESIN COMPOSITION

BACKGROUND OF THE INVENTION

1. Field of the Invention

The present invention relates to a positive-tone radiation-sensitive resin composition suitably used as a chemically-amplified positive resist useful for microfabrication utilizing various types of radiation represented by deep ultraviolet rays such as a KrF excimer laser, an ArF excimer laser, or an $F_2$ excimer laser, X-rays such as synchrotron radiation, and charged particle beams such as electron beams.

2. Background Art

In the field of microfabrication represented by the manufacture of integrated circuit devices, lithographic technology enabling microfabrication with a line width of 0.20 µm or less has been demanded in order to increase the degree of integration in recent years.

A conventional lithographic process utilizes near ultraviolet rays such as an i-line radiation. It is known in the art that microfabrication with a line width of a sub-quarter micron order using near ultraviolet rays is very difficult.

Therefore, use of radiation with a shorter wavelength has been studied for enabling microfabrication with a line width of 0.20 µm or less. As radiation with a shorter wavelength, deep ultraviolet rays represented by a bright line spectrum of a mercury lamp and an excimer laser, X-rays, electron beams, and the like can be given. Of these, a KrF excimer laser (wavelength: 248 nm), an ArF excimer laser (wavelength: 193 nm), and an $F_2$ excimer laser (wavelength: 157 nm) have attracted attention.

As a resist applicable to the shorter wavelength radiations, a number of resists utilizing a chemical amplification effect between a component having an acid-dissociable functional group and a photoacid generator which generates an acid upon irradiation (hereinafter called "exposure") have been proposed. Such a resist is hereinafter called a chemically amplified resist.

As a chemically amplified resist, Japanese Patent Publication No. 27660/1990 discloses a composition comprising a polymer having a t-butyl ester group of a carboxylic acid or t-butylcarbonate group of phenol and a photoacid generator. This composition utilizes the effect of the polymer to release a t-butyl ester group or t-butyl carbonate group by the action of an acid generated upon exposure to form an acidic functional group such as a carboxylic group or a phenolic hydroxyl group, which renders an exposed area on a resist film readily soluble in an alkaline developer.

In recent years, in addition to high limit resolution and high process margin, a high sensitivity to radiations is demanded of chemically amplified resists as a factor determining productivity of a photolithographic process.

Reducing the amount of basic substance which is a component of chemically amplified resists is one of the methods of increasing the sensitivity of the chemically amplified resists. This method, however, not only involves a decrease in the amount of acids produced by a photoacid generator, which gives rise to unduly roughened pattern surfaces, but also impairs environmental resistance of the resist such as poor PED stability, which is an indication of line width stability against a fluctuated period of time from exposure to post heat treatment. One method for obviating this problem is to increase the amount of photoacid generator. However, an increased amount of photoacid generator decreases radiation transmissivity through resist films, resulting in a tendency of easily producing a trapezoid pattern profile rather than a desirable rectangular pattern profile.

In an effort of increasing sensitivity by the use of additives, Japanese Patent Application Laid-open No. 34272/2000 discloses a method of adding a cyclic 1,2-diolmonosulfonate compound as an agent to assist acid generation. However, this method may adversely affect storage stability of radiation-sensitive resin compositions. When the photoacid generator is accidentally decomposed for some reason, an acid may be rapidly produced due to the action of the acid generation assisting agent.

The effect of carbazole compounds to increase the sensitivity of succinimide esters used as a photoacid generator has been reported (J. Am. Chem. Soc. Vol. 110, p. 8736 (1988)). However, this type of compound is highly toxic and readily sublimable. The compound may splash when forming resist patterns, soils the exposure apparatus, and may have an adverse effect on human bodies.

Japanese Patent Application Laid-open No. 2002-265446 disclosed that a chemically-amplified radiation-sensitive resin composition, particularly, that containing a non-sublimating N-substituted carbazole derivative such as N-carboxymethylcarbazole or its ester is particularly highly sensitive and has excellent PED stability and storage stability. However, focal depth allowance of this composition has not been investigated.

An object of the present invention is to provide a positive-tone radiation-sensitive resin composition useful as a chemically amplified positive-tone resist excelling particularly in focal depth allowance, while maintaining excellent basic performance such as high sensitivity, resolution, pattern profile, and PED stability.

SUMMARY OF THE INVENTION

Specifically, the present invention provides a positive-tone radiation-sensitive resin composition comprising:

(A) a carbazole derivative shown by the following formula (1),

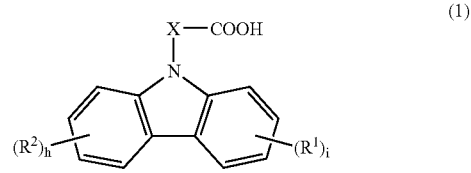

wherein $R^1$ and $R^2$ individually represent a halogen atom, a methyl group, a cyano group, or a nitro group, X represents a linear or branched divalent organic group having 1-20 carbon atoms, and h and i are integers of 0-4, two or more $R^1$ groups and $R^2$ groups which may be present being either the same or different, (B) a photoacid generator containing a sulfonimide compound and an iodonium salt compound as essential components, and (C) an acid-dissociable group-containing resin which is insoluble or scarcely soluble in alkali, but becomes soluble in alkali when the acid-dissociable group dissociates,

DETAILED DESCRIPTION OF THE INVENTION AND PREFERRED EMBODIMENT

The present invention is described below in detail.

Carbazole Derivative (A)

The component (A) of the present invention is a carbazole derivative represented by the above formula (1) (hereinafter referred to as "carbazole derivative (A)").

As examples of the halogen atom represented by $R^1$ or $R^2$ in the formula (1), a fluorine atom, chlorine atom, bromine atom, and iodine atom can be given.

As the integers h and i in the formula (1), zero is particularly preferable.

As examples of linear or branched divalent organic groups having 1-20 carbon atoms represented by X in the formula (1), a methylene group, (methyl)methylene group, ethylene group, (methyl)ethylene group, (ethyl)ethylene group, propylene group, trimethylene group, tetramethylene group, pentamethylene group, hexamethylene group, heptamethylene group, octamethylene group, decamethylene group, and the like can be given.

Of these divalent organic groups, a methyl group, a (methyl)methylene group, and the like are preferable.

The carbazole derivatives (A) can be synthesized according to the method described in Indian J. Chem., Vol. 33B, p. 799 (1994), for example, by reacting carbazole with a halogenated carboxylic acid ester such as ethyl chloroacetate or methyl bromoacetate in the presence of a basic catalyst such as potassium hydroxide or t-butoxy potassium in a suitable solvent such as i-propanol, t-butanol, or dimethylformamide to produce a carbazole derivative in which the N-position is replaced with a carboxylic acid ester group, and saponifying the carbazole derivative in the presence of a basic catalyst such as potassium hydroxide.

The carbazole derivative (A) of the present invention possesses a carbazole skeleton, which is a chromophore (a light-absorbing site or chromophore), and exhibits the effect of sensitizing photoacid generators such as a sulfonamide and a iodonium salt compound. This compound does not sublimate because of the non-plane structure due to bonding of the carboxyl group via a carbon atom with an $SP^3$ orbit.

In the present invention, the carbazole derivative (A) may be used either individually or in combination of two or more.

The amount of the carbazole derivatives (A) used in the present invention is preferably 0.1-40 parts by weight, more preferably 0.2-20 parts by weight, and particularly preferably 1-10 parts by weight for 100 parts by weight of the later-described acid-dissociable group-containing resin (C). If the amount of the carbazole derivatives (A) is less than 0.1 part by weight, the effect of improving the focal depth allowance, in particular, tends to decrease. If the amount exceeds 40 parts by weight, it may be difficult to obtain a rectangular resist pattern due to a decrease in transparency to radiation.

Acid Generator (B)

The component (B) of the present invention is a photoacid generator which contains a sulfonimide compound and an iodonium salt compound as essential components and generates an acid upon irradiation with light (hereinafter referred to as "acid generator (B)").

As examples of the sulfonimide compound, compounds of the following formula (2) can be given:

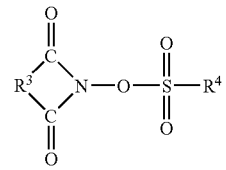

wherein $R^3$ represents a divalent group such as an alkylene group, arylene group, alkoxylene group, and $R^4$ represents a monovalent group such as an alkyl group, aryl group, halogenated alkyl group, and halogenated aryl group.

Specific examples of sulfonimide compounds include:
N-(trifluoromethanesulfonyloxy)succinimide,
N-(trifluoromethanesulfonyloxy)phthalimide,
N-(trifluoromethanesulfonyloxy)diphenylmaleimide,
N-(trifluoromethanesulfonyloxy)bicyclo[2.2.1]hept-5-ene-2,3-dicarboxyimide,
N-(trifluoromethanesulfonyloxy)-7-oxabicyclo[2.2.1]hept-5-ene-2,3-dicarboxyimide,
N-(trifluoromethanesulfonyloxy)bicyclo[2.2.1]heptan-5,6-oxy-2,3-dicarboxyimide,
N-(trifluoromethanesulfonyloxy)naphthylimide,
N-(10-camphorsulfonyloxy)succinimide,
N-(10-camphorsulfonyloxy)phthalimide,
N-(10-camphorsulfonyloxy)diphenylmaleimide,
N-(10-camphorsulfonyloxy)bicyclo[2.2.1]hept-5-ene-2,3-dicarboxyimide,
N-(10-camphorsulfonyloxy)-7-oxabicyclo[2.2.1]hept-5-ene-2,3-dicarboxyimide,
N-(10-camphorsulfonyloxy)bicyclo[2.2.1]heptan-5,6-oxy-2,3-dicarboxyimide,
N-(10-camphorsulfonyloxy)naphthylimide,
N-(n-octanesulfonyloxy)succinimide,
N-(n-octanesulfonyloxy)phthalimide,
N-(n-octanesulfonyloxy)diphenylmaleimide,
N-(n-octanesulfonyloxy)bicyclo[2.2.1]hept-5-ene-2,3-dicarboxyimide,
N-(n-octanesulfonyloxy)-7-oxabicyclo[2.2.1]hept-5-ene-2,3-dicarboxyimide,
N-(n-octanesulfonyloxy)bicyclo[2.2.1]heptan-5,6-oxy-2,3-dicarboxyimide,
N-(n-octanesulfonyloxy)naphthylimide,
N-(p-toluenesulfonyloxy)succinimide,
N-(p-toluenesulfonyloxy)phthalimide,
N-(p-toluenesulfonyloxy)diphenylmaleimide,
N-(p-toluenesulfonyloxy)bicyclo[2.2.1]hept-5-ene-2,3-dicarboxyimide,
N-(p-toluenesulfonyloxy)-7-oxabicyclo[2.2.1]hept-5-ene-2,3-dicarboxyimide,
N-(p-toluenesulfonyloxy)bicyclo[2.2.1]heptan-5,6-oxy-2,3-dicarboxyimide,
N-(p-toluenesulfonyloxy)naphthylimide,
N-(2-trifluoromethylbenzenesulfonyloxy)succinimide,
N-(2-trifluoromethylbenzenesulfonyloxy)phthalimide,
N-(2-trifluoromethylbenzenesulfonyloxy)diphenylmaleimide,
N-(2-trifluoromethylbenzenesulfonyloxy)bicyclo[2.2.1]hept-5-ene-2,3-dicarboxyimide,
N-(2-trifluoromethylbenzenesulfonyloxy)-7-oxabicyclo[2.2.1]hept-5-ene-2,3-dicarboxyimide, N-(2-trifluoromethylbenzenesulfonyloxy)bicyclo[2.2.1]
heptan-5,6-oxy-2,3-dicarboxyimide,
N-(2-trifluoromethylbenzenesulfonyloxy)naphthylimide,
N-(4-trifluoromethylbenzenesulfonyloxy)succinimide,
N-(4-trifluoromethylbenzenesulfonyloxy)phthalimide,
N-(4-trifluoromethylbenzenesulfonyloxy)diphenylmaleimide,
N-(4-trifluoromethylbenzenesulfonyloxy)bicyclo[2.2.1]
hept-5-ene-2,3-dicarboxyimide,
N-(4-trifluoromethylbenzenesulfonyloxy)-7-oxabicyclo
[2.2.1]hept-5-ene-2,3-dicarboxyimide,
N-(4-trifluoromethylbenzenesulfonyloxy)bicyclo[2.2.1]
heptan-5,6-oxy-2,3-dicarboxyimide,
N-(4-trifluoromethylbenzenesulfonyloxy)naphthylimide,
N-(perfluorobenzenesulfonyloxy)succinimide,
N-(perfluorobenzenesulfonyloxy)phthalimide,
N-(perfluorobenzenesulfonyloxy)diphenylmaleimide,
N-(perfluorobenzenesulfonyloxy)bicyclo[2.2.1]hept-5-ene-
2,3-dicarboxyimide,
N-(perfluorobenzenesulfonyloxy)-7-oxabicyclo[2.2.1]hept-
5-ene-2,3-dicarboxyimide,
N-(perfluorobenzenesulfonyloxy)bicyclo[2.2.1]heptan-5,6-
oxy-2,3-dicarboxyimide,
N-(perfluorobenzenesulfonyloxy)naphthylimide,
N-(1-naphthalenesulfonyloxy)succinimide,
N-(1-naphthalenesulfonyloxy)phthalimide,
N-(1-naphthalenesulfonyloxy)diphenylmaleimide,
N-(1-naphthalenesulfonyloxy)bicyclo[2.2.1]hept-5-ene-2,3-
dicarboxyimide,
N-(1-naphthalenesulfonyloxy)-7-oxabicyclo[2.2.1]hept-5-
ene-2,3-dicarboxyimide,
N-(1-naphthalenesulfonyloxy)bicyclo[2.2.1]heptan-5,6-
oxy-2,3-dicarboxyimide,
N-(1-naphthalenesulfonyloxy)naphthylimide,
N-(nonafluoro-n-butanesulfonyloxy)succinimide,
N-(nonafluoro-n-butanesulfonyloxy)phthalimide,
N-(nonafluoro-n-butanesulfonyloxy)diphenylmaleimide,
N-(nonafluoro-n-butanesulfonyloxy)bicyclo[2.2.1]hept-5-
ene-2,3-dicarboxyimide,
N-(nonafluoro-n-butanesulfonyloxy)-7-oxabicyclo[2.2.1]
hept-5-ene-2,3-dicarboxyimide,
N-(nonafluoro-n-butanesulfonyloxy)bicyclo[2.2.1]heptan-
5,6-oxy-2,3-dicarboxyimide,
N-(nonafluoro-n-butanesulfonyloxy)naphthylimide,
N-(perfluoro-n-octanesulfonyloxy)succinimide,
N-(perfluoro-n-octanesulfonyloxy)phthalimide,
N-(perfluoro-n-octanesulfonyloxy)diphenylmaleimide,
N-(perfluoro-n-octanesulfonyloxy)bicyclo[2.2.1]hept-5-
ene-2,3-dicarboxyimide,
N-(perfluoro-n-octanesulfonyloxy)-7-oxabicyclo[2.2.1]
hept-5-ene-2,3-dicarboxyimide,
N-(perfluoro-n-octanesulfonyloxy)bicyclo[2.2.1]heptan-5,
6-oxy-2,3-dicarboxyimide,
N-(perfluoro-n-octanesulfonyloxy)naphthylimide,
N-(benzenesulfonyloxy)succinimide,
N-(benzenesulfonyloxy)phthalimide,
N-(benizenesulfonyloxy)diphenylmaleimide,
N-(benzenesulfonyloxy)bicyclo[2.2.1]hept-5-ene-2,3-dicarboxyimide,
N-(benzenesulfonyloxy)-7-oxabicyclo[2.2.1]hept-5-ene-2,
3-dicarboxyimide,
N-(benzenesulfonyloxy)bicyclo[2.2.1]heptan-5,6-oxy-2,3-
dicarboxyimide, and N-(benizenesulfonyloxy)naphthylimide.

Of these sulfonimide compounds, the following compounds are preferable:
N-(trifluoromethanesulfonyloxy)bicyclo[2.2.1]hept-5-ene-
2,3-dicarboxyimide,
N-(10-camphorsulfonyloxy)succinimide,
N-(p-toluenesulfonyloxy)succinimide,
N-(nonafluorobutylsulfonyloxy)bicyclo[2.2.1]hept-5-ene-2,
3-dicarboxyimide,
N-(benzenesulfonyloxy)bicyclo[2.2.1]hept-5-ene-2,3-dicarboxyimide, and
N-{(5-methyl-5-carboxymethanebicyclo[2,2,1]hept-2-yl)
sulfonyloxy}succinimide.

In the present invention, the sulfonimide compound may be used either individually or in combination of two or more.

The following compounds can be given as specific examples of the iodonium salt compound:
bis(4-t-butylphenyl)iodonium trifluoromethanesulfonate,
bis(4-t-butylphenyl)iodonium nonafluoro-n-butanesulfonate,
bis(4-t-butylphenyl)iodonium perfluoro-n-octanesulfonate,
bis(4-t-butylphenyl)iodonium pyrenesulfonate,
bis(4-t-butylphenyl)iodonium n-dodecylbenzenesulfonate,
bis(4-t-butylphenyl)iodonium p-toluenesulfonate,
bis(4-t-butylphenyl)iodonium benzenesulfonate,
bis(4-t-butylphenyl)iodonium 10-camphorsulfonate,
bis(4-t-butylphenyl)iodonium n-octanesulfonate,
bis(4-t-butylphenyl)iodonium 2-trifluoromethylbenzenesulfonate,
bis(4-t-butylphenyl)iodonium 4-trifluoromethylbenzenesulfonate,
bis(4-t-butylphenyl)iodonium perfluorobenzenesulfonate,
diphenyliodonium trifluoromethanesulfonate,
diphenyliodonium nonafluoro-n-butanesulfonate,
diphenyliodonium perfluoro-n-octanesulfonate,
diphenyliodonium pyrenesulfonate,
diphenyliodonium n-dodecylbenzenesulfonate,
diphenyliodonium p-toluenesulfonate,
diphenyliodonium benzenesulfonate,
diphenyliodonium 10-camphorsulfonate,
diphenyliodonium n-octanesulfonate,
diphenyliodonium 2-trifluoromethylbenzenesulfonate,
diphenyliodonium 4-trifluoromethylbenzenesulfonate,
diphenyliodonium perfluorobenzenesulfonate,
di(p-tolyl)iodonium trifluoromethanesulfonate,
di(p-tolyl)iodonium nonafluoro-n-butanesulfonate,
di(p-tolyl)iodonium perfluoro-n-octanesulfonate,
di(p-tolyl)iodonium pyrenesulfonate,
di(p-tolyl)iodonium n-dodecylbenzenesulfonate,
di(p-tolyl)iodonium p-toluenesulfonate,
di(p-tolyl)iodonium benzenesulfonate,
di(p-tolyl)iodonium 10-camp horsulfonate,
di(p-tolyl)iodonium n-octanesulfonate,
di(p-tolyl)iodonium 2-trifluoromethylbenzenesulfonate,
di(p-tolyl)iodonium 4-trifluoromethylbenzenesulfonate,
di(p-tolyl)iodonium perfluorobenzenesulfonate,
bis(3,4-dimethylphenyl)iodonium trifluoromethanesulfonate,
bis(3,4-dimethylphenyl)iodonium nonafluoro-n-butanesulfonate,
bis(3,4-dimethylphenyl)iodonium perfluoro-n-octanesulfonate,
bis(3,4-dimethylphenyl)iodonium pyrenesulfonate,
bis(3,4-dimethylphenyl)iodonium n-dodecylbenzenesulfonate,
bis(3,4-dimethylphenyl)iodonium p-toluenesulfonate,
bis(3,4-dimethylphenyl)iodonium benzenesulfonate,
bis(3,4-dimethylphenyl)iodonium 10-camphorsulfonate, bis(3,4-dimethylphenyl)iodonium n-octanesulfonate,
bis(3,4-dimethylphenyl)iodonium 2-trifluoromethylbenzenesulfonate,
bis(3,4-dimethylphenyl)iodonium 4-trifluoromethylbenzenesulfonate,
bis(3,4-dimethylphenyl)iodonium perfluorobenzenesulfonate,
(4-nitrophenyl)(phenyl)iodonium trifluoromethanesulfonate,
(4-nitrophenyl)(phenyl)iodonium nonafluoro-n-butanesulfonate,
(4-nitrophenyl)(phenyl)iodonium perfluoro-n-octanesulfonate,
(4-nitrophenyl)(phenyl)iodonium pyrenesulfonate,
(4-nitrophenyl)(phenyl)iodonium n-dodecylbenzenesulfonate,
(4-nitrophenyl)(phenyl)iodonium p-toluenesulfonate,
(4-nitrophenyl)(phenyl)iodonium benzenesulfonate,
(4-nitrophenyl)(phenyl)iodonium 10-camphorsulfonate,
(4-nitrophenyl)(phenyl)iodonium n-octanesulfonate,
(4-nitrophenyl)(phenyl)iodonium 2-trifluoromethylbenzenesulfonate,
(4-nitrophenyl)(phenyl)iodonium 4-trifluoromethylbenzenesulfonate,
(4-nitrophenyl)(phenyl)iodonium perfluorobenzenesulfonate,
bis(3-nitrophenyl)iodonium trifluoromethanesulfonate,
bis(3-nitrophenyl)iodonium nonafluoro-n-butanesulfonate,
bis(3-nitrophenyl)iodonium perfluoro-n-octanesulfonate,
bis(3-nitrophenyl)iodonium pyrenesulfonate,
bis(3-nitrophenyl)iodonium n-dodecylbenzenesulfonate,
bis(3-nitrophenyl)iodonium p-toluenesulfonate,
bis(3-nitrophenyl)iodonium benzenesulfonate,
bis(3-nitrophenyl)iodonium 10-camphorsulfonate,
bis(3-nitrophenyl)iodonium n-octanesulfonate,
bis(3-nitrophenyl)iodonium 2-trifluoromethylbenzenesulfonate,
bis(3-nitrophenyl)iodonium 4-trifluoromethylbenzenesulfonate,
bis(3-nitrophenyl)iodonium perfluorobenzenesulfonate,
(4-methoxyphenyl)(phenyl)iodonium trifluoromethanesulfonate,
(4-methoxyphenyl)(phenyl)iodonium nonafluoro-n-butanesulfonate,
(4-methoxyphenyl)(phenyl)iodonium perfluoro-n-octanesulfonate,
(4-methoxyphenyl)(phenyl)iodonium pyrenesulfonate,
(4-methoxyphenyl)(phenyl)iodonium n-dodecylbenzenesulfonate,
(4-methoxyphenyl)(phenyl)iodonium p-toluenesulfonate,
(4-methoxyphenyl)(phenyl)iodonium benzenesulfonate,
(4-methoxyphenyl)(phenyl)iodonium 10-camphorsulfonate,
(4-methoxyphenyl)(phenyl)iodonium n-octanesulfonate,
(4-methoxyphenyl)(phenyl)iodonium 2-trifluoromethylbenzenesulfonate,
(4-methoxyphenyl)(phenyl)iodonium 4-trifluoromethylbenzenesulfonate,
(4-methoxyphenyl)(phenyl)iodonium perfluorobenzenesulfonate,
bis(4-chlorophenyl)iodonium trifluoromethanesulfonate,
bis(4-chlorophenyl)iodonium nonafluoro-n-butanesulfonate,
bis(4-chlorophenyl)iodonium perfluoro-n-octanesulfonate,
bis(4-chlorophenyl)iodonium pyrenesulfonate,
bis(4-chlorophenyl)iodonium n-dodecylbenzenesulfonate,
bis(4-chlorophenyl)iodonium p-toluenesulfonate,
bis(4-chlorophenyl)iodonium benzenesulfonate,
bis(4-chlorophenyl)iodonium 10-camphorsulfonate,
bis(4-chlorophenyl)iodonium n-octanesulfonate,
bis(4-chlorophenyl)iodonium 2-trifluoromethylbenzenesulfonate,
bis(4-chlorophenyl)iodonium 4-trifluoromethylbenzenesulfonate,
bis(4-chlorophenyl)iodonium perfluorobenzenesulfonate,
di(1-naphthyl)iodonium trifluoromethanesulfonate,
di(1-naphthyl)iodonium nonafluoro-n-butanesulfonate,
di(1-naphthyl)iodonium perfluoro-n-octanesulfonate,
di(1-naphthyl)iodonium pyrenesulfonate,
di(1-naphthyl)iodonium n-dodecylbenzenesulfonate,
di(1-naphthyl)iodonium p-toluenesulfonate,
di(1-naphthyl)iodonium benzenesulfonate,
di(1-naphthyl)iodonium 10-camphorsulfonate,
di(1-naphthyl)iodonium n-octanesulfonate,
di(1-naphthyl)iodonium 2-trifluoromethylbenzenesulfonate,
di(1-naphthyl)iodonium 4-trifluoromethylbenzenesulfonate,
di(1-naphthyl)iodonium perfluorobenzenesulfonate,
biphenyleneiodonium trifluoromethanesulfonate,
biphenyleneiodonium nonafluoro-n-butanesulfonate,
biphenyleneiodonium perfluoro-n-octanesulfonate,
biphenyleneiodonium pyrenesulfonate,
biphenyleneiodonium n-dodecylbenzenesulfonate,
biphenyleneiodonium p-toluenesulfonate,
biphenyleneiodonium benzenesulfonate,
biphenyleneiodonium 10-camphorsulfonate,
biphenyleneiodonium n-octanesulfonate,
biphenyleneiodonium 2-trifluoromethylbenzenesulfonate,
biphenyleneiodonium 4-trifluoromethylbenzenesulfonate,
biphenyleneiodonium perfluorobenzenesulfonate,
2-chlorobiphenyleneiodonium trifluoromethanesulfonate,
2-chlorobiphenyleneiodonium nonafluoro-n-butanesulfonate,
2-chlorobiphenyleneiodonium perfluoro-n-octanesulfonate,
2-chlorobiphenyleneiodonium pyrenesulfonate,
2-chlorobiphenyleneiodonium n-dodecylbenzenesulfonate,
2-chlorobiphenyleneiodonium p-toluenesulfonate,
2-chlorobiphenyleneiodonium benzenesulfonate,
2-chlorobiphenyleneiodonium 10-camphorsulfonate,
2-chlorobiphenyleneiodonium n-octanesulfonate,
2-chlorobiphenyleneiodonium 2-trifluoromethylbenzenesulfonate,
2-chlorobiphenyleneiodonium 4-trifluoromethylbenzenesulfonate,
and 2-chlorobiphenyleneiodonium perfluorobenzenesulfonate.

Of these iodonium compounds, the following compounds are preferable:
bis(4-t-butylphenyl)iodoniumtrifluoromethane sulfonate,
bis(4-t-butylphenyl)iodonium nonafluoro-n-butanesulfonate,
bis(4-t-butylphenyl)iodonium 10-camphorsulfonate,
diphenyliodonium trifluoromethanesulfonate,
diphenyliodonium nonafluoro-n-butanesulfonate, and
diphenyliodonium 10-camphorsulfonate.

A compound having a fluorine-containing substituent in the cation moiety as shown in the following formula (3) is preferable as the iodonium salt compound in the present invention.

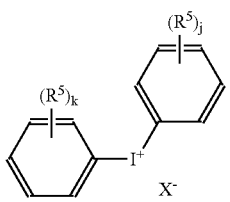

(3)

wherein $R^5$ individually represents a group containing a fluorine atom, j and k represent an integer of 0-5, provided that j+k=1-10, and $X^-$ indicates a sulfonic acid anion.

As specific examples of the iodonium salt compound having a fluorine-containing substituent in the cation moiety,
bis(4-trifluoromethylphenyl)iodonium trifluoromethanesulfonate,
bis(4-trifluoromethylphenyl)iodonium nonafluoro-n-butanesulfonate,
bis(4-trifluoromethylphenyl)iodonium perfluoro-n-octanesulfonate,
bis(4-trifluoromethylphenyl)iodonium pyrenesulfonate,
bis(4-trifluoromethylphenyl)iodonium n-dodecylbenzenesulfonate,
bis(4-trifluoromethylphenyl)iodonium p-toluenesulfonate,
bis(4-trifluoromethylphenyl)iodonium benzenesulfonate,
bis(4-trifluoromethylphenyl)iodonium 10-camphorsulfonate,
bis(4-trifluoromethylphenyl)iodonium n-octanesulfonate,
bis(4-trifluoromethylphenyl)iodonium 2-trifluoromethylbenzenesulfonate,
bis(4-trifluoromethylphenyl)iodonium 4-trifluoromethylbenzenesulfonate,
bis(4-trifluoromethylphenyl)iodonium perfluorobenzenesulfonate,
bis(p-fluorophenyl)iodonium trifluoromethanesulfonate,
di(p-fluorophenyl)iodonium nonafluorobutanesulfonate,
bis(p-fluorophenyl)iodonium 10-camphorsulfonate,
(p-fluorophenyl)(phenyl)iodonium trifluoromethanesulfonate,
(p-fluorophenyl)-diphenylsulfonium trifluoromethanesulfonate,
(p-fluorophenyl)(phenyl)iodonium 10-camphorsulfonate,
bis(p-fluorophenyl)iodonium p-toluenesulfonate, and the like can be given.

Among these iodonium salt compounds having a fluorine-containing substituent in the cation moiety, bis(p-fluorophenyl)iodonium trifluoromethanesulfonate,
bis(p-fluorophenyl)iodonium nonafluoromethanesulfonate,
bis(p-fluorophenyl)iodonium 10-camphorsulfonate,
bis(4-trifluoromethylphenyl)iodonium trifluoromethanesulfonate,
bis(4-trifluoromethylphenyl)iodonium nonafluoro-n-butanesulfonate,
bis(4-trifluoromethylphenyl)iodonium 10-camphorsulfonate, and the like are preferable.

In the present invention, the iodonium salt compound may be used either individually or in combination of two or more.

In the present invention, photoacid generators (hereinafter referred to as "other acid generators") other than the sulfonimide compound and iodonium salt compound can be used in combination with the acid generator (B).

As examples of the other acid generators, onium salt compounds, sulfone compounds, sulfonate compounds, disulfonyl diazomethane compounds, disulfonylmethane compounds, oxime sulfonate compounds, and hydrazine sulfonate compounds can be given.

Other Onium Salt Compounds

As examples of onium salt compounds, sulfonium salts (including thiophenium salts), phosphonium salts, diazonium salts, ammonium salts, and pyridinium salts can be given.

Specific examples of onium salts include:
triphenylsulfonium trifluoromethanesulfonate,
triphenylsulfonium nonafluoro-n-butanesulfonate,
triphenylsulfonium perfluoro-n-octanesulfonate,
triphenylsulfonium pyrenesulfonate,
triphenylsulfonium n-dodecylbenzenesulfonate,
triphenylsulfonium p-toluenesulfonate,
triphenylsulfonium benzenesulfonate,
triphenylsulfonium 10-camphorsulfonate,
triphenylsulfonium n-octanesulfonate,
triphenylsulfonium 2-trifluoromethylbenzenesulfonate,
triphenylsulfonium 4-trifluoromethylbenzenesulfonate,
triphenylsulfonium hexafluoroantimonate,
triphenylsulfonium naphthalenesulfonate,
triphenylsulfonium perfluorobenzenesulfonate,
4-t-butylphenyl.diphenylsulfonium trifluoromethanesulfonate,
4-t-butylphenyl.diphenylsulfonium nonafluoro-n-butanesulfonate,
4-t-butylphenyl.diphenylsulfonium perfluoro-n-octanesulfonate,
4-t-butylphenyl.diphenylsulfonium pyrenesulfonate,
4-t-butylphenyl.diphenylsulfonium n-dodecylbenzenesulfonate,
4-t-butylphenyl.diphenylsulfonium p-toluenesulfonate,
4-t-butylphenyl.diphenylsulfonium benzenesulfonate,
4-t-butylphenyl.diphenylsulfonium 10-camphorsulfonate,
4-t-butylphenyl.diphenylsulfonium n-octanesulfonate,
4-t-butylphenyl.diphenylsulfonium 2-trifluoromethylbenzenesulfonate,
4-t-butylphenyl.diphenylsulfonium 4-trifluoromethanebenzenesulfonate,
4-t-butylphenyl.diphenylsulfonium perfluorobenzenesulfonate,
4-t-butoxyphenyl.diphenylsulfonium trifluoromethanesulfonate,
4-t-butoxyphenyl.diphenylsulfonium nonafluoro-n-butanesulfonate,
4-t-butoxyphenyl.diphenylsulfonium perfluoro-n-octanesulfonate,
4-t-butoxyphenyl.diphenylsulfonium pyrenesulfonate,
4-t-butoxyphenyl.diphenylsulfonium n-dodecylbenzenesulfonate,
4-t-butoxyphenyl.diphenylsulfonium p-toluenesulfonate,
4-t-butoxyphenyl.diphenylsulfonium benzenesulfonate,
4-t-butoxyphenyl.diphenylsulfonium 10-camphorsulfonate,
4-t-butoxyphenyl.diphenylsulfonium n-octanesulfonate,
4-t-butoxyphenyl.diphenylsulfonium 2-trifluoromethylbenzenesulfonate,
4-t-butoxyphenyl.diphenylsulfonium 4-trifluoromethylbenzenesulfonate,
4-t-butoxyphenyl.diphenylsulfonium perfluorobenzenesulfonate,
4-hydroxyphenyl.diphenylsulfonium trifluoromethanesulfonate,
4-hydroxyphenyl.diphenylsulfonium nonafluoro-n-butanesulfonate, 4-hydroxyphenyl.diphenylsulfonium perfluoro-n-octanesulfonate,
4-hydroxyphenyl.diphenylsulfonium pyrenesulfonate,
4-hydroxyphenyl.diphenylsulfonium n-dodecylbenzenesulfonate,
4-hydroxyphenyl.diphenylsulfonium p-toluenesulfonate,
4-hydroxyphenyl.diphenylsulfonium benzenesulfonate,
4-hydroxyphenyl.diphenylsulfonium 10-camphorsulfonate,
4-hydroxyphenyl.diphenylsulfonium n-octanesulfonate,
4-hydroxyphenyl.diphenylsulfonium 2-trifluoromethylbenzenesulfonate,
4-hydroxyphenyl.diphenylsulfonium 4-trifluoromethylbenzenesulfonate,
4-hydroxyphenyl.diphenylsulfonium perfluorobenzenesulfonate,
tri(4-methoxyphenyl)sulfonium trifluoromethanesulfonate,
tri(4-methoxyphenyl)sulfonium nonafluoro-n-butanesulfonate,
tri(4-methoxyphenyl) sulfonium perfluoro-n-octanesulfonate,
tri(4-methoxyphenyl)sulfonium pyrenesulfonate,
tri(4-methoxyphenyl)sulfonium n-dodecylbenzenesulfonate,
tri(4-methoxyphenyl)sulfonium p-toluenesulfonate,
tri(4-methoxyphenyl)sulfonium benzenesulfonate,
tri(4-methoxyphenyl)sulfonium 10-camphorsulfonate,
tri(4-methoxyphenyl) sulfonium n-octanesulfonate,
tri(4-methoxyphenyl)sulfonium 2-trifluoromethylbenzenesulfonate,
tri(4-methoxyphenyl)sulfonium 4-trifluoromethylbenzenesulfonate,
tri(4-methoxyphenyl)sulfonium perfluorobenzenesulfonate,
di(4-methoxyphenyl).p-tolylsulfonium trifluoromethanesulfonate,
di(4-methoxyphenyl).p-tolylsulfonium nonafluoro-n-butanesulfonate,
di(4-methoxyphenyl).p-tolylsulfonium perfluoro-n-octanesulfonate,
di(4-methoxyphenyl).p-tolylsulfonium pyrenesulfonate,
di(4-methoxyphenyl).p-tolylsulfonium n-dodecylbenzenesulfonate,
di(4-methoxyphenyl).p-tolylsulfonium p-toluenesulfonate,
di(4-methoxyphenyl).p-tolylsulfonium benzenesulfonate,
di(4-methoxyphenyl).p-tolylsulfonium 10-camphorsulfonate,
di(4-methoxyphenyl).p-tolylsulfonium n-octanesulfonate,
di(4-methoxyphenyl).p-tolylsulfonium 2-trifluoromethylbenzenesulfonate,
di(4-methoxyphenyl).p-tolylsulfonium 4-trifluoromethylbenzenesulfonate,
di(4-methoxyphenyl).p-tolylsulfonium perfluorobenzenesulfonate,
1-phenyltetrahydrothiophenium trifluoromethanesulfonate,
1-phenyltetrahydrothiophenium nonafluoro-n-butanesulfonate,
1-phenyltetrahydrothiophenium perfluoro-n-octanesulfonate,
1-phenyltetrahydrothiophenium pyrenesulfonate,
1-phenyltetrahydrothiophenium n-dodecylbenzenesulfonate,
1-phenyltetrahydrothiophenium p-toluenesulfonate,
1-phenyltetrahydrothiophenium benzenesulfonate,
1-phenyltetrahydrothiophenium 10-camphorsulfonate,
1-phenyltetrahydrothiophenium n-octanesulfonate,
1-phenyltetrahydrothiophenium 2-trifluoromethylbenzenesulfonate,
1-phenyltetrahydrothiophenium 4-trifluoromethylbenzenesulfonate,
1-phenyltetrahydrothiophenium perfluorobenzenesulfonate,
1-(4-hydroxyphenyl)tetrahydrothiophenium trifluoromethanesulfonate,
1-(4-hydroxyphenyl)tetrahydrothiophenium nonafluoro-n-butanesulfonate,
1-(4-hydroxyphenyl)tetrahydrothiophenium perfluoro-n-octanesulfonate,
1-(4-hydroxyphenyl)tetrahydrothiophenium pyrenesulfonate,
1-(4-hydroxyphenyl)tetrahydrothiophenium n-dodecylbenzenesulfonate,
1-(4-hydroxyphenyl)tetrahydrothiophenium p-toluenesulfonate,
1-(4-hydroxyphenyl)tetrahydrothiophenium benzenesulfonate,
1-(4-hydroxyphenyl)tetrahydrothiophenium 10-camphorsulfonate,
1-(4-hydroxyphenyl)tetrahydrothiophenium n-octanesulfonate,
1-(4-hydroxyphenyl)tetrahydrothiophenium 2-trifluoromethylbenzensulfonate,
1-(4-hydroxyphenyl)tetrahydrothiophenium 4-trifluoromethylbenzensulfonate,
1-(4-hydroxyphenyl)tetrahydrothiophenium perfluorobenzenesulfonate,
phenyl.biphenylenesulfonium trifluoromethanesulfonate,
phenyl.biphenylenesulfonium nonafluoro-n-butanesulfonate,
phenyl.biphenylenesulfonium perfluoro-n-octanesulfonate,
phenyl.biphenylenesulfonium pyrenesulfonate,
phenyl.biphenylenesulfonium n-dodecylbenzenesulfonate,
phenyl.biphenylenesulfonium p-toluenesulfonate,
phenyl.biphenylenesulfonium benzenesulfonate,
phenyl.biphenylenesulfonium 10-camphorsulfonate,
phenyl.biphenylenesulfonium n-octanesulfonate,
phenyl.biphenylenesulfonium 2-trifluoromethylbenzenesulfonate,
phenyl.biphenylenesulfonium 4-trifluoromethylbenzenesulfonate,
phenyl.biphenylenesulfonium perfluorobenzenesulfonate,
(4-phenylthiophenyl).diphenylsulfonium trifluoromethanesulfonate,
(4-phenylthiophenyl).diphenylsulfonium nonafluoro-n-butanesulfonate,
(4-phenylthiophenyl).diphenylsulfonium perfluoro-n-octanesulfonate,
(4-phenylthiophenyl).diphenylsulfonium pyrenesulfonate,
(4-phenylthiophenyl).diphenylsulfonium n-dodecylbenzenesulfonate,
(4-phenylthiophenyl).diphenylsulfonium p-toluenesulfonate;
(4-phenylthiophenyl).diphenylsulfonium benzenesulfonate,
(4-phenylthiophenyl).diphenylsulfonium 10-camphorsulfonate,
(4-phenylthiophenyl).diphenylsulfonium n-octanesulfonate,
(4-phenylthiophenyl).diphenylsulfonium 2-trifluoromethylbenzenesulfonate,
(4-phenylthiophenyl).diphenylsulfonium 4-trifluoromethylbenzenesulfonate,
(4-phenylthiophenyl).diphenylsulfonium perfluorobenzenesulfonate,
4,4'-bis(diphenylsulfoniophenyl)sulfide bis(trifluoromethanesulfonate),
4,4'-bis(diphenylsulfoniophenyl)sulfide bis(nonafluoro-n-butanesulfonate), 4,4'-bis(diphenylsulfoniophenyl)sulfide bis(perfluoro-n-octanesulfonate),
4,4'-bis(diphenylsulfoniophenyl)sulfide bis(pyrenesulfonate),
4,4'-bis(diphenylsulfoniophenyl)sulfide bis(n-dodecylbenzenesulfonate),
4,4'-bis(diphenylsulfoniophenyl)sulfide bis(p-toluenesulfonate),
4,4'-bis(diphenylsulfoniophenyl)sulfide bis(benzenesulfonate),
4,4'-bis(diphenylsulfoniophenyl)sulfide bis(10-camphorsulfonate),
4,4'-bis(diphenylsulfoniophenyl)sulfide bis(n-octanesulfonate),
4,4'-bis(diphenylsulfoniophenyl)sulfide bis(2-trifluoromethylbenzenesulfonate),
4,4'-bis(diphenylsulfoniophenyl)sulfide bis(4-trifluoromethylbenzenesulfonate), and
4,4'-bis(diphenylsulfoniophenyl)sulfide bis(perfluorobenzenesulfonate).

As examples of the sulfone compound, β-ketosulfone, β-sulfonylsulfone, and α-diazo compounds of these compounds can be given.

As specific examples of sulfone compounds, phenacylphenylsulfone, mesitylphenacylsulfone, bis(phenylsulfonyl)methane, and 4-trisphenacylsulfone can be given.

As examples of the sulfonate compound, alkyl sulfonate, haloalkyl sulfonate, aryl sulfonate, and imino sulfonate can be given.

As specific examples of sulfonate compounds, benzointosylate, pyrogallol tris(trifluoromethanesulfonate), pyrogallol tris(nonafluorobutanesulfonate), pyrogallol tris(methanesulfonate), nitrobenzyl-9,10-diethoxyanthracene-2-sulfonate, α-methylolbenzointosylate, α-methylolbenzoin trifluoromethanesulfonate, α-methylolbenzoin n-octanesulfonate, and α-methylolbenzoin n-dodecanesulfonate can be given.

As examples of disulfonyldiazomethane compounds, a compound shown by the following formula (4) can be given:

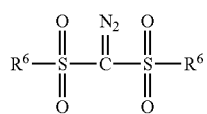

(4)

wherein $R^6$ individually represents a monovalent group such as an alkyl group, aryl group, halogenated alkyl group, and halogenated aryl group.

As specific examples of disulfonyldiazomethane compounds,
bis(trifluoromethanesulfonyl)diazomethane, bis(cyclohexanesulfonyl)diazomethane,
bis(phenylsulfonyl)diazomethane, bis(p-toluenesulfonyl)diazomethane,
bis(2,4-dimethylbenzenesulfonyl)diazomethane,
bis(4-t-butylphenylsulfonyl)diazomethane, bis(4-chlorobenzenesulfonyl)diazomethane,
methylsulfonyl.p-toluenesulfonyldiazomethane,
cyclohexanesulfonyl.p-toluenesulfonyldiazomethane,
cyclohexanelsulfonyl.1,1-dimethylethanesulfonyldiazomethane,
bis(1,1-dimethylethanesulfonyl)diazomethane,
bis(1-methylethanesulfonyl)diazomethane,
bis(3,3-dimethyl-1,5-dioxaspiro[5.5]dodecane-8-sulfonyl)diazomethane, and
bis(1,4-dioxaspiro[4.5]decane-7-sulfonyl)diazomethane can be given.

As examples of the disulfonylmethane compound, compounds represented by the following formula (5) can be given:

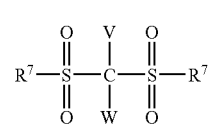

(5)

wherein $R^7$ individually represents a linear or branched monovalent aliphatic hydrocarbon group, a cycloalkyl group, aryl group, aralkyl group, or other monovalent organic groups having a hetero atom, V and W individually represent an aryl group, a hydrogen atom, a linear or branched monovalent aliphatic hydrocarbon group, or other monovalent organic groups having a hetero atom, provided that at least one of V and W represents an aryl group, or V and W bond to form a monocyclic or polycyclic carbon ring having at least one unsaturated bond, or V and W bond to form a group shown by the following formula (6):

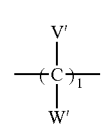

(6)

wherein V' and W' individually represent a hydrogen atom, halogen atom, linear or branched alkyl group, cycloalkyl group, aryl group, or aralkyl group, or V' and W', each bonding to the same or different carbon atoms, bond to form a monocyclic carbon ring, and l is an integer of 2-10.

As examples of oxime sulfonate compounds, compounds of the following formula (7) or (8) can be given:

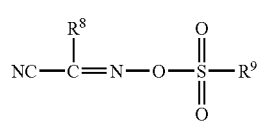

(7)

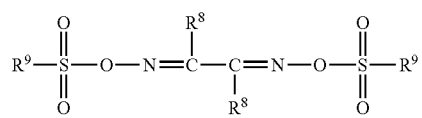

(8)

wherein $R^8$ and $R^9$ individually represent a monovalent organic group.

As specific preferable examples of $R^8$ in the formulas (7) and (8), a methyl group, ethyl group, n-propyl group, phenyl group, tosyl group, trifluoromethyl group, and pentafluoroethyl group can be given. As preferable examples of $R^9$, a phenyl group, tosyl group, and 1-naphthyl group can be given.

As specific examples of hydrazine sulfonate compounds, bis(benzenesulfonyl)hydrazine, bis(p-toluenesulfonyl)hydrazine, bis(trifluoromethanesulfonyl)hydrazine, bis(pentafluoroethanesulfonyl)hydrazine,
bis(n-propanesulfonyl)hydrazine, benzenesulfonylhydrazine,
p-toluenesulfonylhydrazine, trifluoromethanesulfonylhydrazine,
pentafluoroethanesulfonylhydrazine, n-propanesulfonylhydrazine, and
trifluoromethanesulfonyl.p-toluenesulfonylhydrazine can be given.

These other acid generators may be used either individually or in combination of two or more.

The amount of the acid generator (B) used in the present invention is preferably 0.1-20 parts by weight, and more preferably 0.5-15 parts by weight, for 100 parts by weight of the acid-dissociable group-containing resin (C) mentioned later. If the amount of the acid generator (B) is less than 0.1 part by weight, sensitivity and developability tends to decrease. If the amount exceeds 20 parts by weight, transparency to radiation, pattern profile, heat resistance, and the like tend to decrease.

The weight ratio of the sulfonimide compound and iodonium salt compound is preferably from 99:1 to 5:95, more preferably from 95:5 to 40:60, and particularly preferably from 92:8 to 50:50. If the weight ratio is more than 99:1 or less than 5:95, the pattern profile tends to be impaired or the effect of improving the focal depth allowance tends to decrease.

The proportion of the other acid generators to be added is 30 wt % or less, and preferably 10 wt % or less of the total amount of acid generators (B). If the proportion of the other acid generators exceeds 30 wt %, the desired effects of the present invention may be impaired.

Acid-Dissociable Group-Containing Resin (C)

The component (C) of the present invention is an acid-dissociable group-containing resin which is insoluble or scarcely soluble in alkali, but becomes soluble in alkali when the acid-dissociable group dissociates (hereinafter referred to as "acid-dissociable group-containing resin (C)").

If 50% or more of the initial film thickness of a resist film remains after development when the resist film made only from the acid-dissociable group-containing resin (C) is developed under the same alkaline development conditions employed for forming a resist pattern using a resist film formed from a radiation-sensitive resin composition comprising the acid-dissociable group-containing resin (C), such a characteristic of the acid-dissociable group-containing resin (C) is referred to as "insoluble or scarcely soluble in alkali" in the present invention.

As the acid-dissociable group-containing resin (C), a resin, insoluble or scarcely soluble in alkali by itself, obtainable from an alkali-soluble resin containing one or more acid functional groups such as a phenolic hydroxyl group or carboxyl group by replacing one or more hydrogen atoms in the acid functional groups with acid-dissociable groups can be given.

As an example of the acid-dissociable group-containing resin (C) in the present invention, a resin having a recurring unit of the following formula (9) (hereinafter referred to as "recurring unit (9)") and a recurring unit of the following formula (10) (hereinafter referred to as "recurring unit (10)") can be given. This resin is hereinafter referred to as "resin (C1)".

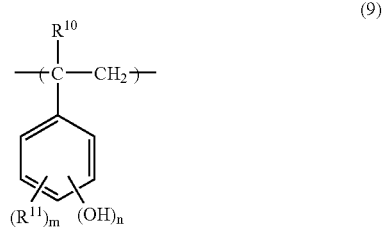

(9)

wherein $R^{10}$ represents a hydrogen atom or a methyl group, $R^{11}$ represents a monovalent organic group (excluding the group same as $-OR^{14}$ in the following formula (10)), m is an integer of 0-3, and n is an integer of 1-3, provided that two or more $R^{11}$ groups, if present, may be either the same or different.

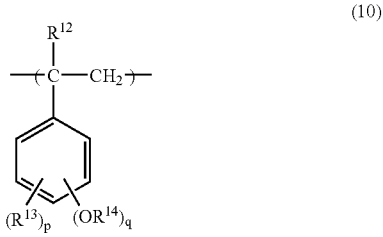

(10)

wherein $R^{12}$ represents a hydrogen atom or a methyl group, $R^{13}$ represents a monovalent organic group (excluding the group same as $-OR^{14}$), $R^{14}$ represents a monovalent acid-dissociable group, p is an integer of 0-3, and q is an integer of 1-3, provided that two or more $R^{13}$ groups and two or more $R^{14}$ groups, if present, may be either the same or different.

As examples of the monovalent organic group represented by $R^{11}$ in the formula (9) and $R^{13}$ in the formula (10), monovalent linear, branched, or cyclic alkyl groups having 1-12 carbon atoms, monovalent aromatic hydrocarbon groups having 6-20 carbon atoms, monovalent oxygen-containing organic groups, and monovalent nitrogen-containing organic groups can be given.

As examples of the alkyl groups, a methyl group, ethyl group, n-propyl group, i-propyl group, n-butyl group, 2-methylpropyl group, 1-methylpropyl group, t-butyl group, cyclopentyl group, and cyclohexyl group can be given.

As examples of the monovalent aromatic hydrocarbon groups, a phenyl group, o-tolyl group, m-tolyl group, p-tolyl group, 2,4-xylyl group, 2,6-xylyl group, 3,5-xylyl group, mesityl group, o-cumenyl group, m-cumenyl group, p-cumenyl group, benzyl group, phenethyl group, 1-naphthyl group, and 2-naphthyl group can be given.

The following groups can be given as examples of the monovalent oxygen-containing organic group: a carboxyl group; linear, branched, or cyclic hydroxyalkyl groups having 1-8 carbon atoms such as a hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, 4-hydroxybutyl group, 3-hydroxycyclopentyl group, and 4-hydroxycyclohexyl group; linear, branched, or cyclic alkoxyl groups having 1-8 carbon atoms such as a methoxy group, ethoxy group, n-propoxy group, i-propoxy group, n-butoxy group, 2-methylpropoxy group, 1-methylpropoxy group, t-butoxy group, cyclopentyloxy group, and cyclohexyloxy group; linear alkoxycarbonyloxy groups having 2-9 carbon atoms such as a methoxycarbonyloxy group, ethoxycarbonyloxy group, n-propoxycarbonyloxy group, and n-butoxycarbonyloxy group; linear, branched, or cyclic (1-alkoxyalkoxy)alkyl groups having 3-11 carbon atoms such as a (1-methoxyethoxy)methyl group, (1-ethoxyethoxy)methyl group, (1-n-propoxyethoxy) methyl group, (1-n-butoxyethoxy)methyl group, (1-cyclopentyloxyethoxy)methyl group, (1-cyclohexyloxyethoxy) methyl group, (1-methoxypropoxy)methyl group, and (1-ethoxypropoxy)methyl group; linear, branched, or cyclic alkoxycarbonyloxyalkyl groups having 3-10 carbon atoms such as a methoxycarbonyloxymethyl group, ethoxycarbonyloxymethyl group, n-propoxycarbonyloxymethyl group, i-propoxycarbonyloxymethyl group, n-butoxycarbonyloxymethyl group, t-butoxycarbonyloxymethyl group, cyclopentyloxycarbonyloxymethyl group, and cyclohexyloxycarbonyloxymethyl group.

Examples of the monovalent nitrogen-containing organic groups include a cyano group; linear, branched, or cyclic cyanoalkyl groups having 2-9 carbon atoms such as a cyanomethyl group, 1-cyanoethyl group, 2-cyanoethyl group, 1-cyanopropyl group, 2-cyanopropyl group, 3-cyanopropyl group, 1-cyanobutyl group, 2-cyanobutyl group, 3-cyanobutyl group, 4-cyanobutyl group, 3-cyanocyclopentyl group, and 4-cyanocyclohexyl group; and the like.

As examples of the monovalent acid-dissociable organic groups represented by $R^{14}$ in the formula (10), a substituted methyl group, 1-substituted ethyl group, 1-branched alkyl group, triorganosilyl group, triorganogermyl group, alkoxycarbonyl group, acyl group, and monovalent cyclic acid-dissociable group can be given.

As examples of the substituted methyl group, a methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, and t-butoxycarbonylmethyl group can be given.

As examples of the 1-substituted methyl group, a 1-methoxyethyl group, 1-methylthioethyl group, 1,1-dimethoxyethyl group, 1-ethoxyethyl group, 1-ethylthio ethyl group, 1,1-diethoxyethyl group, 1-ethoxypropyl group, 1-propoxyethyl group, 1-cyclohexyloxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-isopropoxycarbonylethyl group, 1-n-butoxycarbonylethyl group, and 1-t-butoxycarbonylethyl group can be given.

As examples of the 1-branched alkyl group, an i-propyl group, sec-butyl group, t-butyl group, 1,1-dimethylpropyl group, 1-methylbutyl group, and 1,1-dimethylbutyl group can be given.

As examples of the triorganosilyl group, a trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyldimethylsilyl group, methyldi-t-butylsilyl group, tri-t-butylsilyl group, phenyldimethylsilyl group, methyldiphenylsilyl group, and triphenylsilyl group can be given.

As examples of the triorganogermyl group, a trimethylgermyl group, ethyldimethylgermyl group, methyldiethylgermyl group, triethylgermyl group, isopropyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, and triphenylgermyl group can be given.

As examples of the alkoxycarbonyl group, a methoxycarbonyl group, ethoxycarbonyl group, i-propoxycarbonyl group, and t-butoxycarbonyl group can be given.

As examples of the acyl group, an acetyl group, propionyl group, butyryl group, heptanoyl group, hexanoyl group, valeryl group, pivaloyl group, isovaleryl group, lauroyl group, myristoyl group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, and mesyl group can be given.

As examples of the monovalent cyclic acid-dissociable group, a cyclopropyl group, cyclopentyl group, cyclohexyl group, cyclohexenyl group, 4-methoxycyclohexyl group, tetrahydrofuranyl group, tetrahydropyranyl group, tetrahydrothiofuranyl group, tetrahydrothiopyranyl group, 3-bromotetrahydropyranyl group, 4-methoxytetrahydropyranyl group, 4-methoxytetrahydrothiopyranyl group, and 3-tetrahydrothiophene-1,1-dioxide group can be given.

Of these monovalent acid-dissociable groups, a t-butyl group, benzyl group, 1-methoxyethyl group, 1-ethoxyethyl group, trimethylsilyl group, t-butoxycarbonyl group, t-butoxycarbonylmethyl group, tetrahydrofuranyl group, tetrahydropyranyl group, tetrahydrothiofuranyl group, tetrahydrothiopyranyl group, and the like are preferable.

As examples of preferable recurring units (9) in the present invention, units obtainable by cleavage of a polymerizable unsaturated bond such as 2-hydroxystyrene, 3-hydroxystyrene, 4-hydroxystyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, and 2,4,6-trihydroxystyrene can be given.

The recurring units (9) may be used in the resin (C1) either individually or in combination of two or more.

As examples of preferable recurring units (10) in the present invention, units obtainable by cleavage of a polymerizable unsaturated bond such as 4-t-butoxystyrene, 4-t-butoxy-α-methylstyrene, 4-(2-ethyl-2-propoxy)styrene, and p-(2-ethyl-2-propoxy)-α-methylstyrene can be given.

The recurring units (10) may be used in the resin (C1) either individually or in combination of two or more.

The resin (C1) may comprise recurring units other than the recurring units (9) and (10) (hereinafter referred to as "other recurring units"). The other recurring units include units obtainable by cleavage of a polymerizable unsaturated bond of monomers such as, for example, vinyl aromatic compounds such as styrenes such as styrene, α-methylstyrene, 2-methylstyrene, 3-methylstyrene, 4-methylstyrene, 2-methoxystyrene, 3-methoxystyrene, 4-methoxystyrene, and 4-(2-t-butoxycarbonylethyloxy)styrene; (meth)acrylic esters such as methyl (meth)acrylate, ethyl (meth)acrylate, n-propyl (meth)acrylate, i-propyl (meth)acrylate, n-butyl (meth)acrylate, 2-methylpropyl (meth)acrylate, 1-methylpropyl (meth)acrylate, t-butyl (meth)acrylate, n-pentyl (meth)acrylate, neopentyl (meth)acrylate, n-hexyl (meth)acrylate, 2-ethylhexyl (meth)acrylate, 2-hydroxyethyl (meth)acrylate, 2-hydroxy-n-propyl (meth)acrylate, 3-hydroxy-n-propyl (meth)acrylate, phenyl (meth)acrylate, and benzyl(meth)acrylate; unsaturated carboxylic acids such as (meth)acrylic acid, crotonic acid, maleic acid, fumaric acid, and cinnamic acid, as well as anhydrides of these acids; carboxylalkyl esters of unsaturated carboxylic acids such as 2-carboxyethyl (meth)acrylate, 2-carboxy-n-propyl (meth)acrylate, and 3-carboxy-n-propyl (meth)acrylate; unsaturated nitryl compounds such as (meth)acrylonitrile, α-chloroacrylonitrile, crotonitrile, maleinitrile, and fumaronitrile; unsaturated amide compounds such as (meth)acrylamide, N,N-dimethyl(meth)acrylamide, crotonamide, maleinamide, and fumaramide; unsaturated imide compounds such as maleimide, N-phenylmaleimide, and N-cyclohexylmaleimide; and other nitrogen-containing vinyl compounds such as N-vinyl-ε-caprolactam, N-vinylpyrrolidone, 2-vinylpyridine, 3-vinylpyridine, 4-vinylpyridine, 2-vinylimidazole, and 4-vinylimidazole.

In the resin (C1), these other recurring units may be present either individually or in combination of two or more.

In the present invention, 4-hydroxystyrene/t-butoxystyrene copolymer, 4-hydroxystyrene/t-butoxystyrene/styrene copolymer, and the like are particularly preferable as the resin (C1).

The amount of the acid-dissociable groups introduced into the acid-dissociable group-containing resin (C) (the amount of the number of the acid-dissociable groups in the total number of non-protected acid functional groups and acid-dissociable groups in the acid-dissociable group-containing resin (C)) is preferably 10-100%, and still more preferably 15-100%, although the amount varies depending on the types of acid-dissociable groups and the alkali-soluble resin into which the acid-dissociable groups are introduced.

In the resin (C1), the amount of the recurring unit (9) is preferably 60-80 mol %, and more preferably 65-75 mol %, the amount of the recurring unit (10) is preferably 15-35 mol %, and more preferably 20-30 mol %, and the amount of the other recurring unit is usually 20 mol % or less, and preferably 10 mol % or less. If the amount of the recurring unit (9) is less than 60 mol %, adhesion of resist patterns to substrates tends to decrease; if more than 80 mol %, resolution tends to decrease. If the amount of the recurring unit (10) is less than 15 mol %, resolution tends to decrease; if more than 35 mol %, adhesion of resist patterns to substrates tends to decrease. If the amount of the other recurring unit is more than 20 mol %, the resist tends to exhibit poor resolution.

The polystyrene-reduced weight molecular weight (hereinafter referred to as "Mw") of the acid-dissociable group-containing resin (C) determined by gel permeation chromatography (GPC) is preferably 1,000-150,000, and more preferably 3,000-100,000.

The ratio of Mw to the polystyrene-reduced number molecular weight (hereinafter referred to as "Mn") determined by gel permeation chromatography (Mw/Mn) of the acid-dissociable group-containing resin (C) is usually 1-10, and preferably 1-5.

The acid-dissociable group-containing resin (C) can be manufactured by polymerizing a polymerizable unsaturated monomer corresponding to the recurring unit (9), optionally together with a polymerizable unsaturated monomer providing other recurring unit, and introducing one or more monovalent acid-dissociable groups ($R^{14}$) into the phenolic hydroxyl group of the polymer. The resin (C) can also be manufactured by copolymerizing a polymerizable unsaturated monomer corresponding to the recurring unit (9) and a polymerizable unsaturated monomer corresponding to the recurring unit (10), optionally together with a polymerizable unsaturated monomer providing other recurring unit.

In the present invention, the acid-dissociable group-containing resin (C) may be used either individually or in combination of two or more.

Additives

It is preferable to add an acid diffusion controller to the positive-tone radiation-sensitive resin composition of the present invention. The acid diffusion controller controls diffusion of an acid generated from the acid generator (B) upon exposure in the resist film to hinder unfavorable chemical reactions in the unexposed area.

Use of such an acid diffusion controller improves the preservation stability of the composition and resolution as a resist. Moreover, line width change of the resist pattern due to fluctuation of PED can be controlled, whereby remarkably superior process stability can be achieved.

As the acid diffusion controller, nitrogen-containing organic compounds of which the basicity does not change due to exposure or heat treatment during formation of a resist pattern are preferable.

As examples of such nitrogen-containing organic compounds, a compound shown by the following formula (11) (hereinafter called "nitrogen-containing compound (α),

(11)

wherein $R^{15}$ individually represents a hydrogen atom, alkyl group, aryl group, or aralkyl group which may be substituted or unsubstituted, a diamino compound having two nitrogen atoms in the molecule (hereinafter referred to as "nitrogen-containing compound (β)"), a diamino polymer having three or more nitrogen atoms in the molecule (hereinafter referred to as "nitrogen-containing compound (γ)"), an amide group-containing compound, urea compound, and nitrogen-containing heterocyclic compound can be given.

As examples of the nitrogen-containing compounds (α), linear, branched, or cyclic monoalkylamines such as n-hexylamine, n-heptylamine, n-octylamine, n-nonylamine, n-decylamine, and cyclohexylamine; dialkylamines such as di-n-butylamine, di-n-pentylamine, di-n-hexylamine, di-n-heptylamine, di-n-octylamine, di-n-nonylamine, di-n-decylamine, methyl-cyclohexylamine, and dicyclohexylamine; linear, branched, or cyclic trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; alkanol amines such as an ethanolamine, diethanolamine, and triethanolamine; and aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine can be given.

Examples of the nitrogen-containing compounds (β) include ethylenediamine,
N,N,N',N'-tetramethylethylenediamine,
N,N,N',N'-tetrakis(2-hydroxypropyl)ethylenediamine, tetramethylenediamine,
hexamethylenediamine, 4,4'-diaminodiphenylmethane, 4,4'-diaminodiphenyl ether,
4,4'-diaminobenzophenone, 4,4'-diaminodiphenylamine,
2,2'-bis(4-aminophenyl)propane, 2-(3-aminophenyl)-2-(4-aminophenyl)propane,
2-(4-aminophenyl)-2-(3-hydroxyphenyl)propane,
2-(4-aminophenyl)-2-(4-hydroxyphenyl)propane,
1,4-bis[1-(4-aminophenyl)-1-methylethyl]benzene, and
1,3-bis[1-(4-aminophenyl)-1-methylethyl]benzene.

Examples of the nitrogen-containing compounds (γ) include polyethyleneimine, polyallylamine, and a polymer of N-(dimethylaminoethyl)acrylamide.

Examples of compounds containing an amide group include formamide, N-methylformamide, N,N-dimethylformamide, acetamide, N-methylacetamide, N,N-dimethylacetamide, propionamide, benzamide, pyrrolidone, and N-methylpyrrolidone.

Examples of urea compounds include urea, methylurea, 1,1-dimethylurea, 1,3-dimethylurea, 1,1,3,3-tetramethylurea, 1,3-diphenylurea, and tributylthiourea.

Examples of the nitrogen-containing heterocyclic compounds include imidazoles such as imidazole, benzimidazole, 4-methylimidazole, 4-methyl-2-phenylimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 8-oxyquinoline, and acridine; pyrazine, pyrazole, pyridazine, quinoxaline, purine, pyrrolidine, piperidine, morpholine, 4-methylmorpholine, piperazine, 1,4-dimethylpiperazine, and 1,4-diazabicyclo[2.2.2]octane.

Base precursors possessing an acid-dissociable group, such as
N-(t-butoxycarbonyl)piperidine, N-(t-butoxycarbonyl)imidazole,
N-(t-butoxycarbonyl)benzimidazole, N-(t-butoxycarbonyl)-2-phenylbenzimidazole,
N-(t-butoxycarbonyl)di-n-octylamine, N-(t-butoxy carbonyl)diethanolamine,
N-(t-butoxycarbonyl)dicyclohexylamine, and N-(t-butoxycarbonyl)diphenylamine can be used as nitrogen-containing organic compounds acting as an acid diffusion controller.

Of these nitrogen-containing organic compounds, the nitrogen-containing compound (α), the nitrogen-containing heterocyclic compound, the base precursors possessing an acid-dissociable group are preferable.

The acid diffusion controllers may be used either individually or in combination of two or more.

The amount of the acid diffusion controller to be added is usually 15 parts by weight or less, preferably 0.001-10 parts by weight, and still more preferably 0.005-5 parts by weight for 100 parts by weight of the acid-dissociable group-containing resin (C). If the amount of the acid diffusion controller exceeds 15 parts by weight, sensitivity as a resist and developability of the exposed area tend to decrease. If the proportion is less than 0.001 part by weight, accuracy of pattern profiles and dimensions as a resist may decrease depending on processing conditions.

Surfactants exhibiting an action of improving the applicability or striation of the composition and developability as a resist may be added to the positive-tone radiation-sensitive resin composition of the present invention.

Examples of such surfactants include polyoxyethylene lauryl ether, polyoxyethylene stearyl ether, polyoxyethylene oleyl ether, polyoxyethylene n-octyl phenol ether, polyoxyethylene n-nonyl phenol ether, polyethylene glycol dilaurate, polyethylene glycol distearate, and commercially available products such as FTOP EF301, EF303, EF352 (manufactured by TOHKEM PRODUCTS CORPORATION), MEGAFAC F171, F173 (manufactured by Dainippon Ink and Chemicals, Inc.), Fluorad FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.), KP341 (manufactured by Shin-Etsu Chemical Co., Ltd.), and Polyflow No. 75, No. 95 (manufactured by Kyoeisha Chemical Co., Ltd.).

These surfactants may be used either individually or in combination of two or more.

The amount of the surfactants to be added is usually 2 parts by weight or less for 100 parts by weight of the acid-dissociable group-containing resin (C).

Sensitizers other than the carbazole derivative (A) can be added to the positive-tone radiation-sensitive resin composition of the present invention (such sensitizers are hereinafter referred to as "other acid sensitizers").

As preferable examples of the other sensitizers, benzophenones, rose bengals, and anthracenes can be given.

These other sensitizers may be used either individually or in combination of two or more.

The amount of the other sensitizers to be added is usually 50 parts by weight or less for 100 parts by weight of the acid-dissociable group-containing resin (C).

In addition, a dye and/or a pigment may be added to visualize latent images of exposed areas and to reduce the effect of halation during exposure. An adhesion adjuvant may be added to improve adhesion to the substrate.

Halation inhibitors such as 4-hydroxy-4'-methylchalcone, form improvers, preservation stabilizers, antifoaming agents, and the like can also be added.

Solvent

When used, the positive-tone radiation-sensitive resin composition is usually prepared into a composition solution by homogeneously dissolving the composition in a solvent so that the total solid concentration is 0.1-50 wt %, and preferably 1-40 wt %, and filtering the solution using a filter with a pore diameter of about 0.2 μm.

Examples of solvents used for the preparation of the composition solution include: ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, and i-propyl lactate; aliphatic carboxylic acid esters such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, butyl 3-methoxyacetate, butyl 3-methyl-3-methoxyacetate, butyl 3-methyl-3-methoxypropionate, butyl 3-methyl-3-methoxybutyrate, methyl acetoacetate, ethyl acetoacetate, methyl pyruvate, and ethyl pyruvate; aromatic hydrocarbons such as toluene and xylene; ketones such as methyl ethyl ketone, 2-pentanone, 2-hexanone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; and lactones such as γ-butyrolactone.

These solvents may be used either individually or in combinations of two or more.

Formation of Resist Pattern

A resist pattern is formed from the positive-tone radiation-sensitive resin composition of the present invention by applying the composition solution prepared as mentioned above to substrates such as a silicon wafer or a wafer covered with aluminum using an appropriate application method such as rotational coating, cast coating, and roll coating to form a resist film. The resist film is then optionally heated at a temperature of about 70-160° C. (hereinafter referred to as "PB") and exposed to light through a predetermined mask pattern.

Radiation used here can be appropriately selected according to the types of acid generator (B) from deep ultraviolet rays such as a KrF excimer laser (wavelength: 248 nm), ArF excimer laser (wavelength: 193 nm), or $F_2$ excimer laser (wavelength: 157 nm), X-rays such as synchrotron radiation, and charged particle rays such as electron beams.

The exposure conditions such as the light exposure are appropriately determined depending on the composition of the positive-tone radiation-sensitive resin composition, types of additives, and the like.

In the present invention, it is preferable to perform post-exposure bake (hereinafter referred to as "PEB") at 70-160° C. for 30 seconds or more in order to steadily form a minute resist pattern with high precision. If the heating temperature for PEB is less than 70° C., sensitivity may fluctuate according to the type of substrates.

A desired resist pattern is obtained by developing the resist using an alkaline developer at 10-50° C. for 10-200 seconds, preferably at 15-30° C. for 15-100 seconds and still more preferably at 20-25° C. for 15-90 seconds.

As the alkaline developer, an alkaline aqueous solution prepared by dissolving an alkali compound such as an alkali metal hydroxide, aqueous ammonia, mono-, di-, or tri-alkylamine, mono-, di-, or tri-alkanolamine, heterocyclic amine, tetraalkylammonium hydroxide, choline, 1,8-diazabicyclo[5.4.0]-7-undecene, or 1,5-diazabicyclo[4.3.0]-5-nonene to a concentration of 1-10 wt %, preferably 1-5 wt %, and particularly preferably 1-3 wt % can be used.

Moreover, an appropriate amount of a water-soluble organic solvent such as methanol and ethanol or a surfactant can be added to the developer comprising the above alkaline aqueous solution.

When forming a resist pattern, a protective film may be provided on the resist film in order to prevent an adverse effect of basic impurities and the like which are present in the environmental atmosphere.

The positive-tone radiation-sensitive resin composition of the present invention has particularly excellent focal depth allowance, while maintaining excellent basic performance such as high sensitivity, resolution, pattern profile, and PED stability as a chemically-amplified resist responsive to active radiation such as deep ultraviolet rays represented by a KrF excimer laser (wavelength: 248 nm), an ArF excimer laser (wavelength: 193 nm), and an $F_2$ excimer laser (wavelength: 157 nm). The resist is particularly characterized by excellent film thickness uniformity and storage stability. The resin composition can be suitably used in the field of microfabrication represented by fabrication of integrated circuit devices that are expected to be more and more miniaturized.

EXAMPLES

The present invention is described below in more detail by examples. However, these examples should not be construed as limiting the present invention.

<Synthesis of Carbazole Derivative (A)>

Synthesis Example 1

81 g of t-butoxy potassium was mixed with a solution of 100 g of carbazole in 500 g of dimethylformamide (DMF). 110 g of methyl bromoacetate was gradually dropped to the mixture at room temperature, followed by stirring for four hours at room temperature. Then, 106 g of 35 wt % sodium hydroxide aqueous solution was added dropwise to the reaction solution and the resulting mixture was stirred for two hours at room temperature. Next, 1,000 g of ethyl acetate and 1,000 g of distilled water were added to the reaction solution to separate the solution into two layers. The organic layer was discarded. 1,000 g of 2 N hydrochloric acid was added to the water layer, followed by stirring at room temperature for one hour. Then, 1,000 g of ethyl acetate was added to the mixture to separate the solution into two layers and the water layer was discarded. The organic layer was neutralized with the addition of 0.5 wt % sodium hydrogencarbonate aqueous solution and washed with distilled water. After condensing the organic layer, a small amount of ethyl acetate was added to crystallize the product, thereby obtaining 65 g of a pale yellow solid.

This compound is referred to as "carbazole derivative (A-1)".

$^1$H-NMR spectrum of the carbazole derivative (A-1) was measured to confirm a carbazole peak at 7.0-8.4 ppm and a methylene group peak at 5.2 ppm. Ultraviolet absorption spectrum was measured to confirm peaks at wavelengths of 236 nm and 259 nm and $\epsilon_{248}$=4,300. Deuterated acetone was used as a solvent for $^1$H-NMR spectrum measurement and acetonitrile was used as a solvent for measurement of ultraviolet absorption spectrum.

Based on the results of these measurements and the result of elemental analysis, carbazole derivative (A-1) was identified as N-carboxymethylcarbazole.

<Preparation of Acid-Dissociable Group-Containing Resin (C)>

Synthesis Example 2

101 g of 4-acetoxystyrene, 5 g of styrene, 42 g of 4-t-butoxystyrene, 6 g of azobisisobutylonitrile (AIBN), and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of n-hexane to coagulate and purify the resulting resin. After the addition of 150 g of propylene glycol monomethyl ether to the resin, 300 g of methanol, 80 g of triethylamine, and 15 g of water were added. The mixture was hydrolyzed for eight hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 16,000 and 1.7 respectively. The result of $^{13}$C-NMR spectrum analysis confirmed that the copolymerization molar ratio of 4-hydroxystyrene, styrene, and 4-t-butoxystyrene of the copolymer was 72:5:23. This resin is referred to as "acid-dissociable group-containing resin (C-1)".

Mw and Mn of the acid-dissociable group-containing resin (C-1) were measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene Example 1 and Comparative Example 1

Components shown in Table 1 (part(s) indicates part(s) by weight) were mixed to prepare homogeneous solutions. The solutions were filtered through a membrane filter with a pore diameter of 0.2 μm to prepare solution compositions. The composition solution was spin-coated on a silicon wafer. PB was then performed under the conditions shown in Table 2 to form a resist film with a thickness of 0.4 μm.

The resist films were exposed to KrF excimer laser (wavelength: 248 nm) using a stepper "S203B" (manufactured by Nikon Corp., numerical aperture: 0.68) and baked (PEB) under the conditions shown in Table 2. Then, the resist was developed by a paddle method using an aqueous solution of 2.38 wt % tetramethylammonium hydroxide for one minute at 23° C., washed with purified water, and dried to obtain a resist pattern.

The results of the evaluation of each resist are shown in Table 2.

Evaluation of resists was carried out as follows.

Sensitivity

Sensitivity was evaluated based on an optimum exposure dose which is a dose capable of forming a 1:1 line and space pattern (1L1S) with a line width of 0.15 μm, when a resist coating formed on a silicon wafer substrate is exposed to light, immediately followed by PEB, development, washing with water, and drying.

Focal Depth Allowance

A resist pattern was formed at an optimum dose at which a 1L1S with a line width of 0.15 μm is formed by changing the focal depth from −1.0 μm to +1.0 μm at an interval of 0.1 μm. The focal depth range in which the resist pattern line width is in the range of 0.135-0.165 μm was taken as the focal depth allowance.

Components other than the carbazole derivative (A-1) and the acid-dissociable group-containing resin (C-1) shown in Table 1 are as follows.

Acid Generator (B)

B-1: Bis(4-t-butylphenyl)iodonium 10-camphorsulfonate

B-2: N-(trifluoromethanesulfonyloxy)bicyclo[2.2.1]hept-5-ene-2,3-dicarboxyimide

B-3: Bis (p-fluorophenyliodonium) 10-camphorsulfonate

B-4: Phenyl(p-fluorophenyliodonium) 10-camphorsulfonate

Acid Diffusion Controller

D-1: N-(t-butoxycarbonyl)-2-phenylbenzimidazole

Solvent

S-1: Ethyl lactate

S-2: Ethyl 3-ethoxypropionate

TABLE 1

| | Carbazole derivative (A) (part by weight) | Acid generator (B) (part by weight) | Acid-dissociable group-containing resin (C) (part by weight) | Acid diffusion controller (part by weight) | Solvent (part by weight) |
|---|---|---|---|---|---|
| Example 1 | A-1 (1) | B-1 (2) | C-1 (100) | D-1 (0.2) | S-1 (400) |
| | | B-2 (5) | | | S-2 (400) |
| Example 2 | A-1 (1) | B-3 (2) | C-1 (100) | D-1 (0.2) | S-1 (400) |
| | | B-2 (5) | | | S-2 (400) |
| Example 3 | A-1 (1) | B-4 (2) | C-1 (100) | D-1 (0.2) | S-1 (400) |
| | | B-2 (5) | | | S-2 (400) |
| Comparative Example 1 | — | B-2 (6) | C-1 (100) | D-1 (0.2) | S-1 (400) |
| | | | | | S-2 (400) |

TABLE 2

|  | PB | | PEB | | | Focal depth |
| --- | --- | --- | --- | --- | --- | --- |
|  | Temperature (° C.) | Time (Sec.) | Temperature (° C.) | Time (Sec.) | Sensitivety (J/m$^2$) | allowance (μm) |
| Example 1 | 120 | 90 | 120 | 90 | 350 | 0.80 |
| Example 2 | 120 | 90 | 120 | 90 | 340 | 0.90 |
| Example 3 | 120 | 90 | 120 | 90 | 330 | 0.90 |
| Comparative Example 1 | 120 | 90 | 120 | 90 | 320 | 0.50 |

What is claimed is:

1. A positive-tone radiation-sensitive resin composition comprising:

(A) a carbazole derivative shown by the following formula (1),

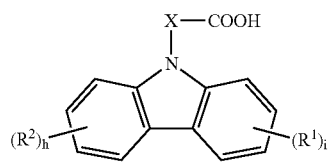

(1)

wherein R$^1$ and R$^2$ individually represent a halogen atom, a methyl group, a cyano group, or a nitro group, X represents a linear or branched divalent organic group having 1-20 carbon atoms, and h and i are integers of 0-4, two or more R$^1$ groups and R$^2$ groups, if present, being either the same or different, (B) a photoacid generator comprising a sulfonimide compound and an iodonium salt compound, wherein the iodonium compound has a fluorine substituent as a cationic moiety, and (C) an acid-dissociable group-containing resin which is insoluble or scarcely soluble in alkali, but becomes soluble in alkali when the acid-dissociable group dissociates, wherein the resin comprises a recurring unit of the following formula (9),

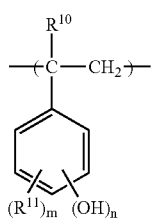

(9)

wherein R$^{10}$ represents a hydrogen atom or a methyl group, R$^{11}$ represents a monovalent organic group (excluding the group same as —OR$^{14}$ in the following formula (10)), m is an integer of 0-3, and n is an integer of 1-3, provided that two or more R$^{11}$ groups, if present, may be either the same or different, and a recurring unit of the following formula (10),

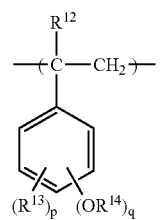

(10)

wherein R$^{12}$ represents a hydrogen atom or a methyl group, R$^{13}$ represents a monovalent organic group (excluding the group same as —OR$^{14}$), R$^{14}$ represents a monovalent acid-dissociable group, p is an integer of 0-3, and q is an integer of 1-3, provided that two or more R$^{13}$ groups and two or more R$^{14}$ groups, if present, may be either the same or different.

2. The positive-tone radiation-sensitive resin composition according to claim 1, wherein the sulfonimide compound in the component (B) is at least one compound selected from the group consisting of
N-(trifluoromethanesulfonyloxy)bicyclo[2.2.1]hept-5-ene-2,3-dicarboxyimide,
N-(10-camphorsulfonyloxy)succinimide,
N-(p-toluenesulfonyloxy)succinimide,
N-(nonafluorobutylsulfonyloxy)bicyclo[2.2.1]hept-5-ene-2,3-dicarboxyimide,
N-(benzenesulfonyloxy)bicyclo[2.2.1]hept-5-ene-2,3-dicarboxyimide, and N-{(5-methyl-5-carboxymethanebicyclo[2,2,1]hept-2-yl)sulfonyloxy}succinimide.

3. The positive-tone radiation-sensitive resin composition according to claim 2, wherein the amount of the photoacid generator (B) is 0.5-15 parts by weight for 100 parts by weight of the acid-dissociable group-containing resin (C).

4. The positive-tone radiation-sensitive resin composition according to claim 3, wherein the weight ratio of the sulfonimide compound to the iodonium salt compound is 92:8 to 50:50.

5. The positive-tone radiation-sensitive resin composition according to claim 4, wherein the recurring unit (9) is a unit obtainable by cleavage of a polymerizable unsaturated bond of at least one compound selected from the group consisting of 2-hydroxystyrene, 3-hydroxystyrene, 4-hydroxystyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, and 2,4,6-trihydroxystyrene.

6. The positive-tone radiation-sensitive resin composition according to claim 4, wherein the recurring unit (10) is a unit obtainable by cleavage of a polymerizable unsaturated bond of at least one compound selected from the group consisting of 4-t-butoxystyrene, 4-t-butoxy-α-methylstyrene, 4-(2-ethyl-2-propoxy)styrene, and p-(2-ethyl-2-propoxy)-α-methylstyrene.

7. The positive-tone radiation-sensitive resin composition according to claim 4, wherein the acid-dissociable group-containing resin (C) is a 4-hydroxystyrene/t-butoxystyrene copolymer or 4-hydroxystyrene/t-butoxystyrene/styrene copolymer.

8. The positive-tone radiation-sensitive resin composition according to claim 7, wherein the amount of the recurring unit (9) is 65-75 mol %, the amount of the recurring unit (10) is 20-30 mol %, and the amount of the other recurring unit is 10 mol % or less.

9. The positive-tone radiation-sensitive resin composition according to claim 8, wherein the acid-dissociable group-containing resin (C) has a polystyrene-reduced weight molecular weight (Mw) determined by gel permeation chromatography (GPC) of 3,000-100,000 and the ratio of Mw to the polystyrene-reduced number molecular weight (Mn) determined by gel permeation chromatography (Mw/Mn) is 1-10.

10. The positive-tone radiation-sensitive resin composition according to claim 9, wherein the linear or branched divalent organic group having 1-20 carbon atoms represented by X in the formula (1) is selected from the group consisting of a methylene group, (methyl)methylene group, ethylene group, (methyl)ethylene group, (ethyl)ethylene group, propylene group, trimethylene group, tetramethylene group, pentamethylene group, hexamethylene group, heptamethylene group, octamethylene group, and decamethylene group.

11. The positive-tone radiation-sensitive resin composition according to claim 10, wherein the amount of the carbazole derivative (A) is 1-10 parts by weight for 100 parts by weight of the acid-dissociable group-containing resin (C).

12. A method comprising:
applying the composition of claim 1 to a substrate to form a film;
exposing the film to radiation.

13. The method of claim 12, wherein the radiation is a KrF excimer laser, an ArF excimer laser, or an $F_2$ excimer laser.

* * * * *